(12) United States Patent
Bruel

(10) Patent No.: US 9,196,490 B2
(45) Date of Patent: Nov. 24, 2015

(54) METHOD AND DEVICE FOR HEATING A LAYER OF A PLATE BY PRIMING AND LIGHT FLOW

(75) Inventor: Michel Bruel, Veurey-Voroize (FR)

(73) Assignee: S.O.I. TEC SILICON ON INSULATOR TECHNOLOGIES, Chemin des Franques (FR)

( * ) Notice: Subject to any disclaimer, the term of this patent is extended or adjusted under 35 U.S.C. 154(b) by 1149 days.

(21) Appl. No.: 13/127,468

(22) PCT Filed: Oct. 27, 2009

(86) PCT No.: PCT/FR2009/052069
§ 371 (c)(1),
(2), (4) Date: Jul. 20, 2011

(87) PCT Pub. No.: WO2010/052408
PCT Pub. Date: May 14, 2010

(65) Prior Publication Data
US 2011/0293254 A1    Dec. 1, 2011

(30) Foreign Application Priority Data
Nov. 4, 2008  (FR) ..................... 08 57476

(51) Int. Cl.
*F27D 11/12* (2006.01)
*H01L 21/268* (2006.01)
*H01L 21/22* (2006.01)

(52) U.S. Cl.
CPC ............ *H01L 21/268* (2013.01); *H01L 21/221* (2013.01)

(58) Field of Classification Search
CPC .... H01L 21/268; H01L 21/221; B82Y 10/00; G03F 7/70033; G03F 7/0041; G03F 7/70166; G03F 7/70916; G03F 7/7055; H05G 2/00; G21K 1/01; G21K 1/043
USPC .............. 219/121.85; 392/407; 438/758, 795, 438/798, 514; 257/629
See application file for complete search history.

(56) References Cited

U.S. PATENT DOCUMENTS 4,234,356 A * 11/1980 Auston et al. .................. 438/799
4,476,375 A * 10/1984 Ogawa ..................... 219/121.72
(Continued)

FOREIGN PATENT DOCUMENTS

FR         2 921 752        4/2009
WO       WO 03/075329      9/2003

OTHER PUBLICATIONS

S. .M. Sze, Physics of Semiconductor Devices, N° ISBN 0-07-062735-.5, 1981. p. 20-Fig. 2 and p. 26-Fig. 16, Second Edition, John Wiley & Sons.
(Continued)

*Primary Examiner* — Eric Stapleton
(74) *Attorney, Agent, or Firm* — Blakely Sokoloff Taylor & Zafman LLP

(57) ABSTRACT

The invention relates to a method and to a device for at least locally heating a plate including at least one layer (2) to be at least locally heated by at least one main, light flow pulse, and including at least one priming region (4) located deeply relative to the front surface of said layer to be heated, wherein the main flow (7) is capable of heating said layer to be heated (2) while the temperature of the latter is within a high temperature range (PHT), and a priming a secondary heating means (9) capable of heating said priming region from a temperature within a low temperature range (PBT) up to a temperature within said high temperature range (PHT).

14 Claims, 7 Drawing Sheets

(56) References Cited

U.S. PATENT DOCUMENTS

| | | | |
|---|---|---|---|
| 4,745,018 A * | 5/1988 | Chihara et al. | 428/141 |
| 4,803,021 A * | 2/1989 | Werth et al. | 264/400 |
| 4,979,464 A * | 12/1990 | Kunze-Concewitz et al. | 118/719 |
| 6,110,813 A * | 8/2000 | Ota et al. | 438/597 |
| 6,548,370 B1 * | 4/2003 | Kasahara et al. | 257/419 |
| 6,573,161 B1 * | 6/2003 | Miyasaka et al. | 438/487 |
| 6,927,109 B1 * | 8/2005 | Tanaka et al. | 438/166 |
| 6,987,275 B2 * | 1/2006 | Bakker et al. | 250/492.2 |
| 7,078,321 B2 * | 7/2006 | Yoshimoto | 438/486 |
| 7,307,283 B2 * | 12/2007 | Yoshimoto | 257/72 |
| 7,338,913 B2 * | 3/2008 | Kasahara et al. | 438/795 |
| 7,419,861 B2 * | 9/2008 | Tanaka et al. | 438/166 |
| 7,565,084 B1 * | 7/2009 | Wach | 398/201 |
| 7,642,205 B2 * | 1/2010 | Timans | 438/795 |
| 7,901,870 B1 * | 3/2011 | Wach | 430/321 |
| 2003/0040130 A1 * | 2/2003 | Mayur et al. | 438/14 |
| 2003/0160233 A1 * | 8/2003 | Rendon et al. | 257/37 |
| 2004/0248425 A1 * | 12/2004 | Bem et al. | 438/758 |
| 2005/0054217 A1 * | 3/2005 | Klomp et al. | 438/795 |
| 2005/0148210 A1 * | 7/2005 | Bakker et al. | 438/798 |
| 2006/0043367 A1 * | 3/2006 | Chang et al. | 257/66 |
| 2006/0127822 A1 * | 6/2006 | Bem et al. | 430/324 |
| 2006/0228897 A1 * | 10/2006 | Timans | 438/758 |
| 2007/0036994 A1 * | 2/2007 | Andre et al. | 428/457 |
| 2010/0288741 A1 * | 11/2010 | Bruel | 219/121.85 |

OTHER PUBLICATIONS

English translation of the International Preliminary Report on Patentability (Chapter 1).

* cited by examiner

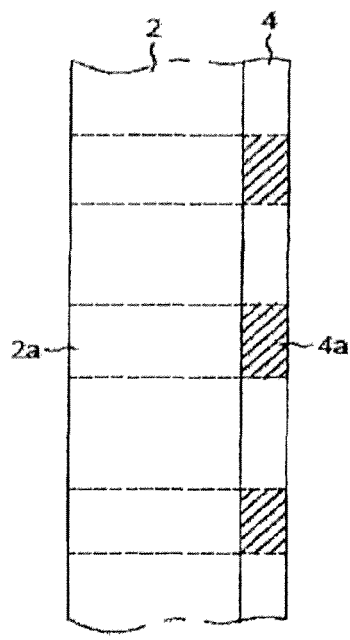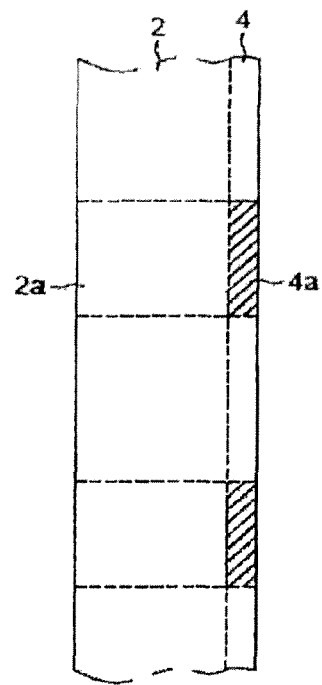

METHOD AND DEVICE FOR HEATING A LAYER OF A PLATE BY PRIMING AND LIGHT FLOW

This is a non-provisional application claiming the benefit of International application number PCT/FR2009/052069 filed Oct. 27, 2009.

The present invention relates to the general technical field of the treatment of material, in particular in the field of thin films, wafers, plates or platelets of material, particularly semi-conductors, in particular silicon.

More specifically, the present invention relates to the field of the application of thermal treatments to parts by means of light flow.

In the prior art, knowledge and methods exist that make use of light flows to realise thermal treatments, in which the absorption of the light flows takes place at the exterior surface and/or in the vicinity of the exterior surface of parts and the heating of deeper portions takes place through thermal diffusion from the exterior surface and/or from its vicinity receiving the light flow to deeper areas of the part to be treated.

The characteristic of these methods of the prior art is that the light flows used are chosen such that the material to be treated is naturally absorbent vis-à-vis the light flow or made absorbent by the direct interaction of the light flow with the material of the part, for example by using extremely high power levels.

The use of light flow proves to be particularly useful when it is wished to be able to heat a surface layer for very short times, of the order of a fraction of a microsecond to several tens of microseconds.

Nevertheless, since the thickness heated changes in general as the square root of the time from the exterior surface of the part, it is extremely difficult and costly to heat deep portions of the part and it is more and more difficult and costly the greater the depths involved.

In addition, since the thermal profile obtained in the part generally speaking has a maximum at the exterior surface and decreases in the material from said exterior surface, it is necessary to limit the surface temperature to the maximum temperature that the material must not exceed within the scope of the method, for example the melting or vaporisation or decomposition temperature of the material. This limit imposes moderate flows of light intensity and long durations and thus high costs.

Moreover, the patent WO 03/075329 proposes negating an absorbent sub-layer by a light flow through a front layer. After which, the heat produced in the sub-layer heats through diffusion the front layer, to a temperature below that reached in the sub-layer.

The U.S. Pat. No. 4,234,356 describes a heating method in which a first beam, emitted in the direction of a face of a layer, is capable of raising the temperature of said face up to a temperature causing its melting, and in which a second beam, emitted in the direction of the face opposite to the layer and which has the characteristic of not being absorbed by the material in the solid state and of being absorbed by the material in the liquid state, maintains in the liquid state the portion of the layer that has been melted by the first beam.

The object of the present invention is a method for at least locally heating a plate including at least one layer to be at least locally heated by at least one main light flow pulse, and including at least one priming region located deeply relative to the front surface of said layer to be heated, made of a material different from that of the layer to be heated.

In the above method, the wavelength of said main light flow may be chosen such that the coefficient of absorption of said flow by the material of the layer to be heated is low while the temperature of the material of said layer to be heated is in a low temperature range (PBT) and that this absorption coefficient sharply increases with temperature when the temperature of the material of the layer to be heated passes into a high temperature range (PHT) approximately above said low temperature range, the characteristics of said main light flow being such that it is, on its own, incapable of heating directly the material of the layer to be heated from a temperature within said low temperature range (PBT) up to a temperature within said high temperature range (PHT).

Another object of the present invention is a method for at least locally heating a plate comprising at least one layer to be at least locally heated, up to a temperature level to be reached, by at least one main light flow pulse, and including at least one priming region located deeply relative to the front surface of said layer to be heated.

In the above method, the wavelength of said main light flow is chosen such that the coefficient of absorption of said flow by the material of the layer to be heated is low while the temperature of the material of said layer to be heated is in a low temperature range (PBT) and that said absorption coefficient increases sharply with temperature when the temperature of the material of the layer to be heated passes into a high temperature range (PHT) approximately above this low temperature range, the area of transition (TT) between the low temperature range (PBT) and the high temperature range (PHT) being below said level of temperature to be reached, the characteristics of said main light flow being such that it is, on its own, incapable of heating directly the material of the layer to be heated from a temperature within said low temperature range (PBT) up to a temperature within said high temperature range (PHT).

According to any of the above methods of the invention, said priming region of said plate may be heated, at least partially, by a priming secondary heating means, such that said priming region heats through thermal diffusion a portion of the layer to be heated adjacent to or close to said priming region up to a temperature within said high temperature range (PHT) to make said portion highly absorbent of said main light flow.

Said main light flow may be applied to said plate, at least locally, by said front surface of said layer to be heated, such that, said portion adjacent to or close to said layer to be heated, which has become highly absorbent, generating an absorbent thermal front, the temperature of which is within said high temperature range (PHT), said absorbent thermal front progresses towards said front surface under the combined effect of a thermal diffusion towards the front of the thermal front and an input of thermal energy by said light flow which reaches said thermal front as soon as the temperature of said thermal front passes into said high temperature range (PHT).

The start of the application of said main light flow may correspond approximately to the end of the application of said priming secondary heating means.

The start of the application of said main light flow may be before the end of the application of said priming secondary heating means.

Said main light flow may be chosen so as to be absorbed by said priming region, the heating of said priming region being realised by said priming secondary heating means and by said main light flow.

Said priming secondary heating means may be applied by said front surface of said layer to be heated and/or by one surface of said plate opposite to said front surface.

Said priming secondary heating means may be a heat flow generated by a heat source.

Said priming secondary heating means may be a flow of particles, said priming region being heated by the energy resulting from the slowing down and/or the stopping of said particles in said priming region.

Said priming secondary heating means may be a flow of radiation, said priming region being heated by absorption of said radiation.

Said priming region may be formed by a portion of said layer to be heated.

Said priming region may be formed by a sub-layer adjacent to or close to said layer to be heated.

Said low temperature range (PBT) and said high temperature range (PHT) may be separated by a transition threshold of the behaviour of the absorption coefficient as a function of temperature.

Said transition threshold of the behaviour of the absorption coefficient as a function of temperature may extend over a range of temperature.

The layer to be heated may be lightly doped silicon.

The layer to be heated may be a semi-conductor material.

Said low temperature range (PBT) may substantially correspond to the range in which the doping is not intrinsic and said high temperature range (PHT) corresponds substantially to the range in which the doping is intrinsic.

The main light flow may be generated by a laser.

Another object of the present invention is a device for at least locally heating a plate including at least one layer to be at least locally heated, by at least one main light flow pulse, and including at least one priming region located deeply relative to the front surface of said layer to be heated.

Said device may comprise a means of emission of said main flow capable of heating through absorption said layer to be heated when the temperature of the latter is within a high temperature range (PHT) and a priming secondary heating means, capable of heating said priming region from a temperature within a low temperature range (PBT) up to a temperature within said high temperature range (PHT).

The present invention will be better understood on studying methods and devices for thermally treating plates, described by way of non limiting examples and illustrated by the drawings in which:

FIG. 8 shows another variant of a priming region;

FIG. 9 shows another variant of a priming region;

Figure 10:
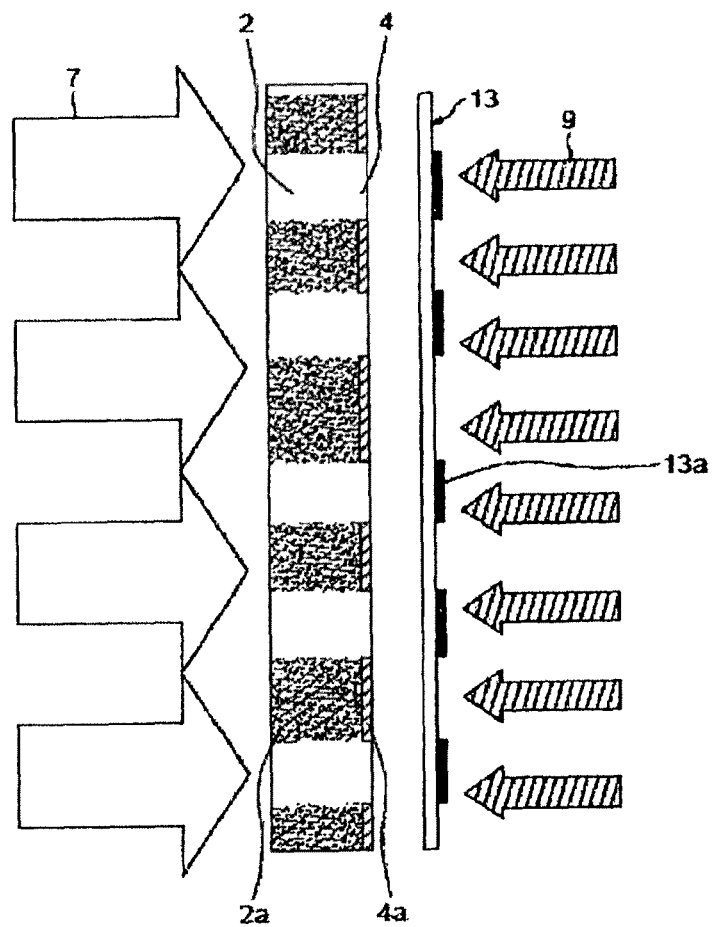

and FIG. 10 represents another variant of application of a priming flow and a main flow.

Figure 1:
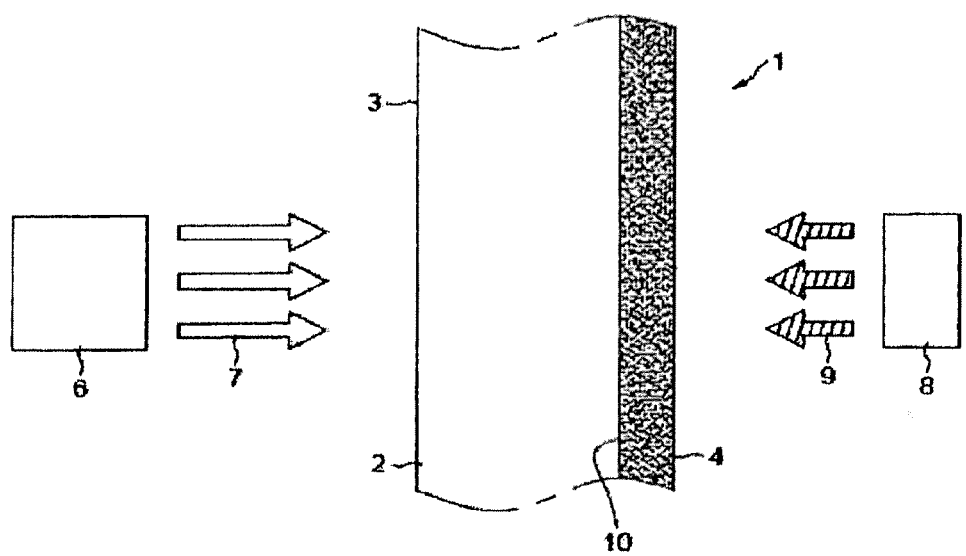
FIG. 1 represents a section of a plate with priming region and associated equipment to produce a main light flow and a priming light flow.

In FIG. 1 is represented a plate 1 which comprises a layer 2 to be heated, for example up to a temperature level Tsat (FIG. 5), which has a front surface 3, and a priming sub-layer 4, for example made of a material different from the layer to be heated 2, placed against the rear surface 5 of the layer 2.

Facing the front surface 3 of the layer 2 is installed a main generator 6 of pulses Pp of a main light flow 7 to said front surface 3.

The layer to be heated 2 and the main light flow 7 are chosen in relation to each other so as to have the following characteristics.

Figure 5:
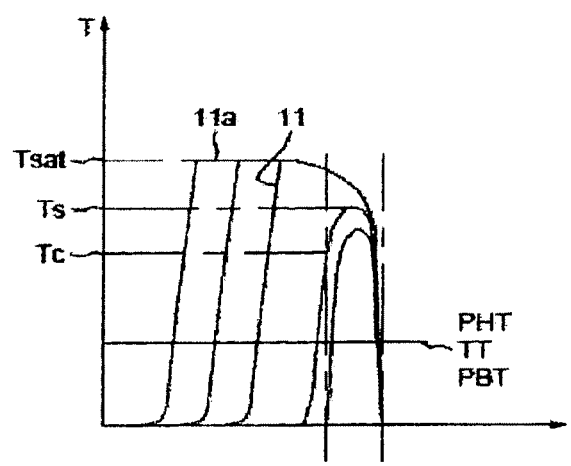
FIG. 5 represents a diagram of the change in temperature over the thickness of a plate.

The wavelength of the main light flow 7 is such that the coefficient of absorption of this flow by the layer 2 is low while the temperature T of the material of said layer 2 is in a low temperature range PBT and that said absorption coefficient increases sharply with temperature when the temperature T of the material of the layer 2 passes into a high temperature range PHT approximately above said low temperature range PBT. The low temperature range PBT and the high temperature range PHT naturally have an area of transition TT (FIG. 5).

The characteristics of the light flow 7, in particular its duration and its intensity, are moreover such that, on it own, said main light flow 7 is incapable of heating directly the layer to be heated 2 from a temperature within the low temperature range PBT up to a temperature within the high temperature range PHT.

In addition, the area of transition (TT) between the low temperature range (PBT) and the high temperature range (PHT) may be below said temperature level to be reached Tsat.

To one side and facing the priming sub-layer 4 is installed a secondary generator 8 of priming pulses Ps of a priming secondary light flow 9 to this sub-layer 4.

The priming sub-layer 4 and the priming secondary light flow 9 are chosen in relation to each other so as to have the following characteristics.

The priming secondary light flow 9 and the coefficient of absorption by the priming sub-layer 4 of said secondary light flow 9 are chosen in relation to each other such that at least one portion of the priming sub-layer 4 is heated by the priming secondary light flow 9. Thereby heated, the priming sub-layer 4 can heat through thermal diffusion a portion 10 of the layer to be heated 2 adjacent to the priming sub-layer 4 up to a temperature within the high temperature range PHT so as to make said portion highly absorbent, said temperature being able to be below said temperature level to be reached.

For example, the priming sub-layer 4 and the priming secondary light flow 9 may be chosen in relation to each other so that the absorption coefficient of the priming sub-layer 4 is high, as much in the low temperature range PBT as in the high temperature range PHT.

Figure 2:
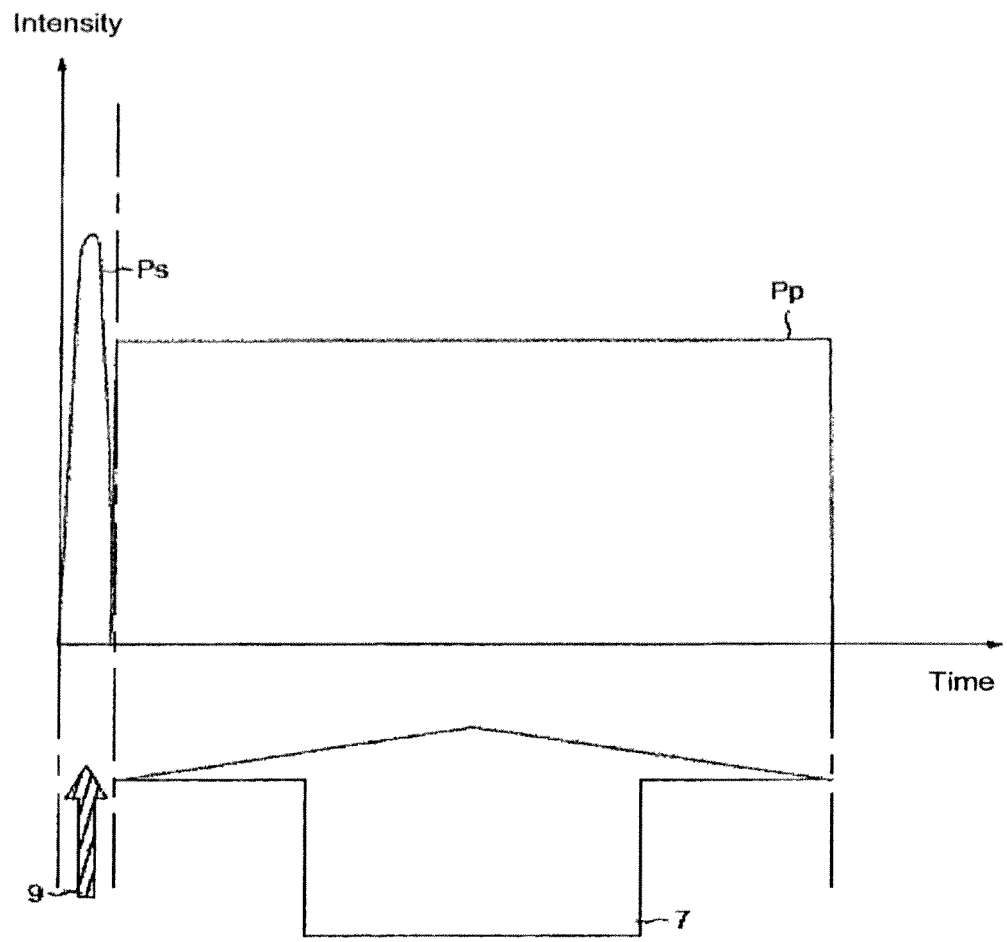
FIG. 2 represents as a function of time the intensity of a priming flow and a main flow in the case where the start of the main flow coincides with the end of the priming flow.

According to a variant represented in FIG. 2, the main light flow 7 may be applied just following the priming secondary light flow 9.

Figure 3:
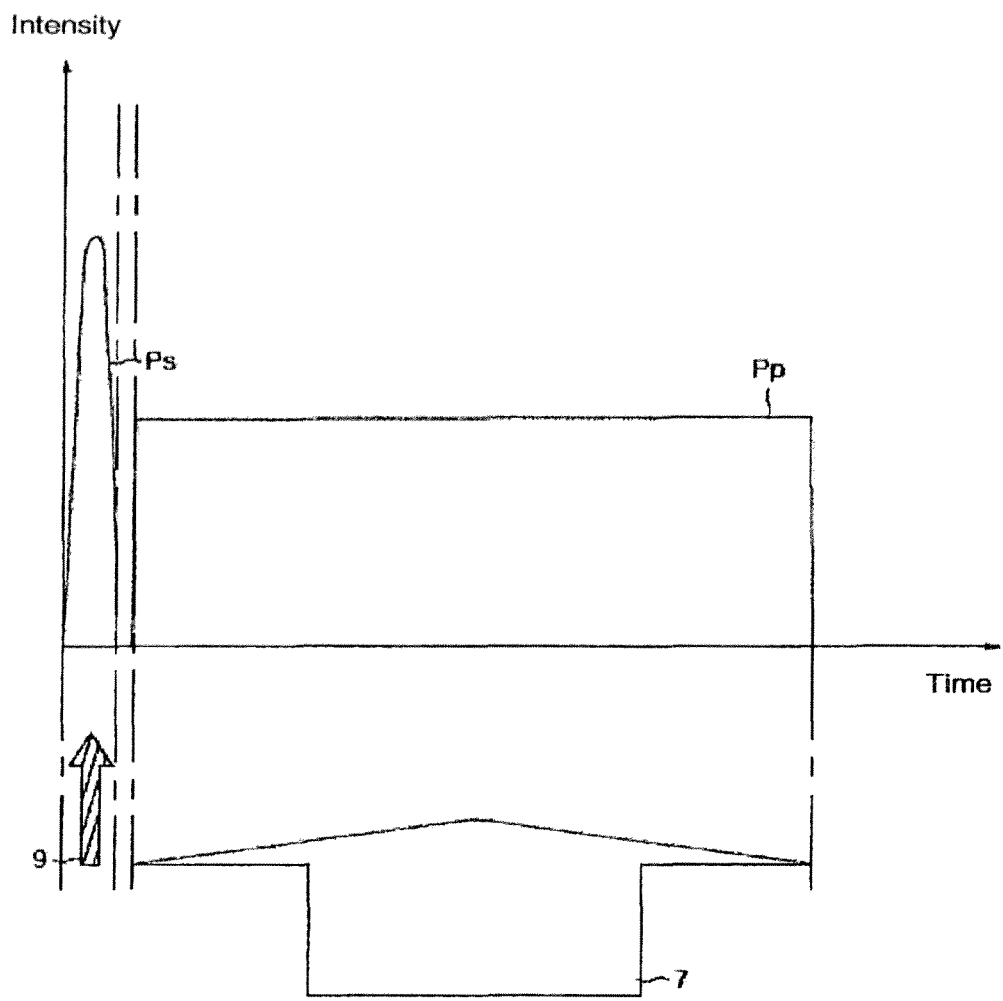
FIG. 3 represents as a function of time the intensity of a priming flow and a main flow in the case where the start of the main flow takes place after the end of the priming flow.

According to a variant represented in FIG. 3, the main light flow 7 may be applied following the priming secondary light flow 9, with a time lapse between them.

Figure 4:
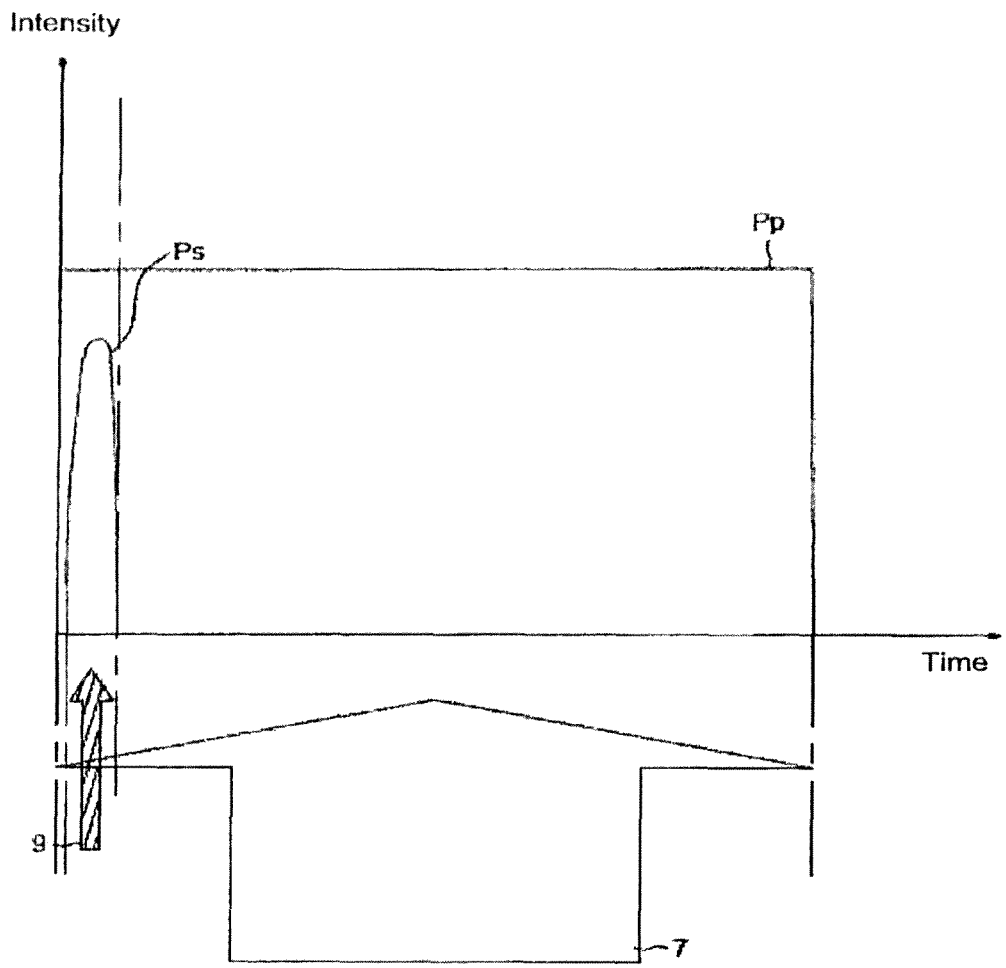
FIG. 4 represents as a function of time the intensity of a priming flow and a main flow in the case where the start of the main flow takes place before the end of the priming flow.

According to a variant represented in FIG. 4, the main light flow 7 may be applied such that its start of application is before the end of application of the priming secondary light flow 9 and continues after this end. In this case, it may be advantageous that the priming sub-layer 4 is capable of absorbing the main light flow 7 such that the latter participates in the desired heating of the priming sub-layer 4.

By applying the priming secondary light flow 9 and the main light flow 7 according to the variants above, the mechanism that takes place may be the following, said mechanism being illustrated schematically in FIG. 5, in correspondence with FIG. 1.

The heating of the sub-layer 4, by the priming secondary light flow 9 (FIG. 2 or 3) or by said priming secondary light flow 9 and a first portion of the main light flow 7 (FIG. 4), to a temperature Ts within the high temperature range PHT at least in a portion of its thickness, generates the heating through thermal diffusion of the portion 10 of the layer to be heated 2 adjacent to the sub-layer 4, up to a temperature within the high temperature range PHT.

The portion 10 of the layer to be heated 2 to a temperature Tc within the high temperature range PHT, is thereby made highly absorbent and generates deeply the priming of an absorbent thermal front 11.

The main light flow 7, applied by the front surface 3 of the layer to be heated 2, penetrates into the layer to be heated 2 and reaches said absorbent thermal front 11.

Said absorbent thermal front 11 then progresses towards the front surface 3 under the combined effect of a thermal diffusion towards the front of the absorbent thermal front 11 and an input of thermal energy by the main light flow 7 which reaches said thermal front through the not highly absorbent remainder of the layer to be heated 2 and still capable of being traversed by the main light flow 7.

During the progression of the thermal front, the maximum temperature of the thermal front tends progressively to stabilise itself, to a substantially constant value Tsat to be reached, above Ts and Tc. During the progression of the thermal front 11, at a given time, the temperature profile in the layer to be heated 2 is composed of an abrupt portion corresponding to the thermal front 11 and a substantially flat portion 11a corresponding to Tsat over the thickness of the layer to be heated already covered by the thermal front 11.

By way of example, if the layer 2 is crystalline silicon and the main flow 7 is a CO2 laser flow, Tsat may be of the order of 1500 K with flows of 2 to 5 E6W/Cm2, Tsat being able to be equal to the melting temperature of 1687 K with complete melting of the silicon for flows of the order of 1.5 to 3 E7W/Cm2.

The temperature Tsat depends on the main flow 7, but also on the priming flow 9 and the priming mechanism. In order to determine a more precise value of Tsat, it is necessary to resolve the heat equation in one dimension, by the finite differences method known to those skilled in the art, using standard commercially available software.

When the main light flow 7 stops, the progression of the thermal front 11, according to this mode of propagation, ceases almost immediately in the layer 2 if it has not reached the front surface 3. The evolution of the thermal front 10 then becomes governed uniquely by the effects of thermal diffusion.

Under the particular conditions of constant light flow 7, the heating of the layer 2 takes place over a thickness substantially in linear relation with the duration of the heat flow.

The sequencing of the phases described above does not exclude a partial temporal overlap of the above phases.

Figure 6:
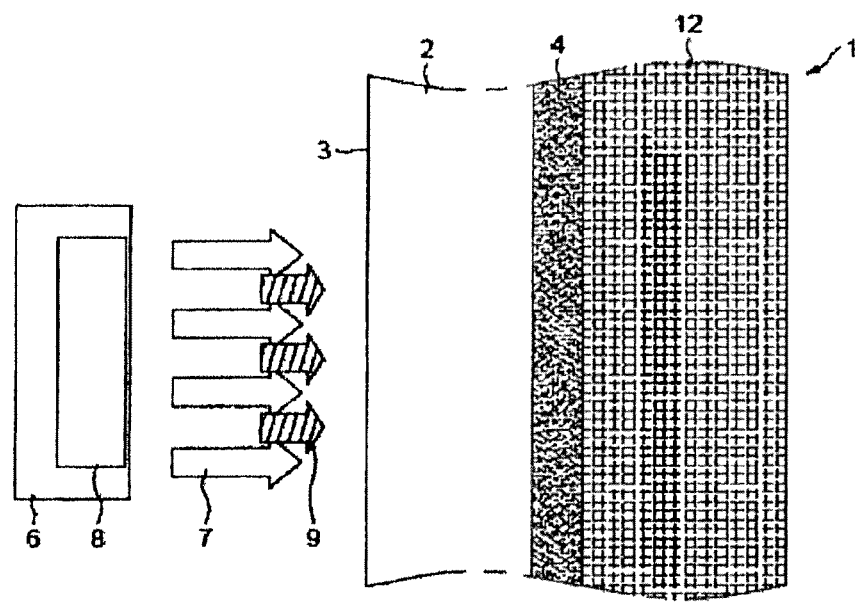
FIG. 6 represents another lay out of a priming flow and a main flow.

In a variant of embodiment represented in FIG. 6, in which, for example, the plate 1 may moreover have a rear layer 12 that can not be traversed by the secondary flow 9, the generators 6 and 8 are placed to one side of the face 3 and the priming secondary light flow 9 is applied to the sub-layer 4 by the front throughout the layer to be heated 2, the layer to be heated 2 not being able to be heated by absorption of the priming secondary light flow 9. The mechanism of heating the sub-layer 4 and the layer to be heated 2 takes place as described above.

Figure 7:
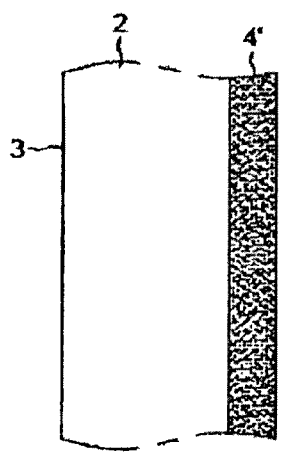
FIG. 7 shows a variant of a priming region.

In a variant of embodiment represented in FIG. 7, the sub-layer 4 may be formed by a rear priming portion 4' of the layer to be heated 2, said rear portion being capable of being heated by absorption of the priming secondary light flow 9 so that the heating mechanism takes place as described above. In this case, the priming region may be defined as the portion 4' of the layer to be heated 2, the temperature of which will be taken into the high temperature range PHT at the end of the priming flow by the priming flow 9.

In the variants that have just been described, the sub-layer 4 constitutes in totality a priming region. Nevertheless, said region could be divided up.

As shown in FIG. 8, the priming region could be formed uniquely by a portion or portions 4a of such a sub-layer, said portions 4a being capable of being heated through absorption of the priming secondary light flow 9. As shown in FIG. 9, the priming region could be formed uniquely by a rear priming portion or portions 4a of the layer to be heated 2, said portions 4a being capable of being heated through absorption of the priming secondary light flow 9. In these examples, the layer to be heated 2 could be heated uniquely in its portions 2a situated above portions 4a of the sub-layer 4.

Examples of Implementation

The transparent material constituting the layer to be heated 2 may be silicon doped to a level of the order of 1.E15/Cm3 to 5.E15/Cm3 and initially placed at ambient temperature.

The main light flow 7 may be a CO2 laser pulse of 6 microseconds duration with a flow of 3.75*1.E6 W/Cm2.

The absorption of a CO2 laser flow in the silicon is essentially governed by the electrical carrier density. Under the conditions described herein, the absorption coefficient of silicon is of the order of several Cm-1, which is low and remains substantially constant while the temperature of the silicon has not reached around 270° C. From around this temperature, the intrinsic concentration of carriers becomes greater than 1*E15 Cm-2 (See the document entitled "Physics of Semiconductor Devices", second Edition, N° ISBN 0-07-062735-5, by S. M. SZE, John Wiley and Sons, 20 page 20—FIG. 12 and page 26—FIG. 16) and increases sharply with temperature.

The low temperature range PBT is thus the range of temperature substantially below the lower temperature limit LIT equal to around 270° C., whereas the high temperature range PHT is the range substantially above 270° C. According to the above document, the low temperature range PBT is within the non Intrinsic domain, of saturation and/or gel of carriers and the high temperature range PHT is within the intrinsic domain.

The material constituting the priming sub-layer may be lightly doped silicon and the priming secondary flow 9 may be, for example, a flow of electrons of 50 kev with a current density of the order of 50 to 100 A/Cm2, an excimer laser flow at a wavelength of around 360 nm, a frequency doubled (wavelength around 503 nm) or frequency tripled (wavelength around 353 nm) YAG laser flow.

In another embodiment, the material constituting the sub-layer 4 may be silicon doped to a level of the order of 3.E19/Cm3, thus different from the chosen material of the layer to be heated 2, and initially placed at ambient temperature and the priming flow may be a CO2 laser flow; under these conditions, the absorption coefficient of the priming flow in the sub-layer 4 is of the order of 1000 Cm-1. The thickness of the sub-layer 4 may be around 10 μm.

According to a first example of obtaining the plate 1, a silicon substrate doped at a rate of 1*E15 Cm-3 and of thickness equal to 100 μm is formed by thinning a standard silicon wafer. Through one of the surfaces, an implantation of boron ions is carried out at a dose of several 3*E16/Cm2 at an energy of 200 keV and an annealing is carried out at a temperature of around 1000° C. to 1100° C. for two hours so as to attain a doping depth of around 10 microns to obtain the sub-layer 4, the remaining thickness of 90 μm constituting the layer to be heated 2, the layer 2 and the layer 4 thus being made of different materials. The surface not used for the implantation then constitutes the surface 3 through which the main light flow 7, and if appropriate the secondary flow 9, will be applied.

Alternatively, within the scope of this first example, a silicon substrate doped at a rate of $1*E15$ Cm-3 and of thickness equal to 90 μm is formed by thinning a standard silicon wafer. On one of the surfaces, an epitaxy of silicon doped to a level of several $5*E19/Cm3$ and of 10 microns thickness is carried out. This epitaxied layer then constitutes the sub-layer 4 and is thus made of a material different from that of the layer 2 to be heated.

According to a second example of obtaining the plate 1, on a standard silicon substrate is carried out an epitaxy of silicon doped with antimony at a rate of $2*E19/Cm3$ and of 10 microns thickness to constitute the sub-layer 4. Then, above the epitaxy of 10 microns, an epitaxy of silicon doped at a rate of $1*E15/Cm3$ and of 90 microns thickness is carried out to constitute the layer 2.

By way of complementary examples, the absorbent material constituting the sub-layer 4 could also have been, in the case where a CO2 layer is used, an amorphous silicon layer, a layer totally or partially amorphised by ion implantation, or a layer of silicon oxide SiO2, thus different from the chosen material of the layer to be heated 2.

If a part constituted exclusively of the layer 2, without the sub-layer 4 is imagined, and if the light flow defined above is applied, it may be noted that the temperature of the material increases by less than 30° C. This result may ensue from a simulation by resolution of the heat equation by a method known as finite differences, a method which forms part of the prior art.

This result could also have been obtained by applying the following simple formalism:

identification of the maximum value Alphamax of the absorption coefficient in the low temperature range PBT the order of magnitude of the maximum temperature reached Tmax may then be given by the formula $Tmax=Phi*tau*alphamax/Cp$ in which Cp is the heat capacity, Phi is the flow, Tau is the duration of the flow and Cp the volumetric heat, and with Phi equal to $3.75*1$, K6W/Cm2, tau equal to $6*1.E-6$ S, alphamax equal to 2 Cm-1 and Cp equal to 1.4 J/Cm3.

It is then found that the order of magnitude of the maximum temperature Tmax reached by the unique layer 2 is equal to 32° C.

It may indeed be noted that, generally speaking, under these conditions, that the temperature of the layer to be heated 2 remains very low and within the low temperature range PBT, without reaching the high temperature range PHT.

On the other hand, in the presence of the sub-layer 4, it is possible to heat a large thickness of the transparent material constituting the layer to be heated 2 up to temperatures of the order of 1650 K, for example, over thicknesses of the order of 60 μm.

EXAMPLES OF APPLICATION

Example 1

Starting with a wafer-support (rear layer 12) of metallurgical grade silicon, on the surface of this wafer is deposited by a CVD deposition technique a layer 4 of two microns thickness doped at a rate of $5*1.E19/Cm3$ and above a thick layer 2 of non doped polycrystalline silicon of 60 microns thickness, the layer 2 and the layer 4 thus being made of different materials. Consequently, at ambient temperature, said layer 2 to be heated is substantially transparent to a light flow generated by a CO2 laser and the sub-layer 4 is absorbent of such a light flow.

The presence of the metallurgical silicon wafer-support 12 prevents the rear surface being used to send the priming flow 9. The priming flow 9 is thus sent by the front surface 3, as well as the main flow 7, as described above with reference to FIG. 6.

The priming flow 9 may be a CO2 laser pulse of 50 nS duration and of intensity $2*1.E7W/cm2$. This may be generated for example by a CO2 laser with transverse excitation.

For example simultaneously as shown in FIG. 4, the main light flow 7 is applied from a CO2 laser, for example a very high power laser with longitudinal excitation, by the front surface 3 of the layer to be heated 2, for example locally on one or more areas. The duration of the main flow 7 is for example two microseconds with an intensity of 3.E7W/cm2.

By way of variant of FIG. 4, the priming flow 9 may take place in this example during the time of build up in power of the main flow 7, which may be of the order of 100 nS, the build up time of the priming flow 9 being, for its part, much shorter and of the order of several nS.

Thereby heated, under the cooperative effect of the heating of the sub-layer 4 by the priming flow 9 and the heating of the sub-layer 4 by the main light flow 6, the priming sub-layer 4 rises very quickly in temperature and can heat through thermal diffusion a portion 10 of the layer to be heated 2 adjacent to the priming sub-layer 4 up to a temperature within the high temperature range PHT to make said portion highly absorbent.

According to the mechanism described previously, a liquefaction may take place by heating of the layer 2 over an area corresponding approximately to the area of application of the main light flow 6, said liquefied area beginning in the area 10 of the layer 2, from which the thermal front 11 progresses towards the front until for example reaching the front face 3.

In this example, the cooperative effect of the priming flow 9 and the main flow 7 makes it possible to heat very quickly the priming layer, thus making the heating by thermal diffusion of the portion 10 more rapid and thus enabling the temperature profile to converge more rapidly towards the saturation temperature Tsat.

After the end of application of the main flow 7, the re-solidification of the liquefied material may if appropriate lead to the formation of larger grains with a preferential crystallographic orientation.

In this method, the metallurgical silicon wafer support 12 is only very slightly heated, thereby limiting the risks of migration of parasite impurities from the wafer to the layer to be heated 2.

By scanning, the whole layer 2 could be treated.

Such an area, treated in this way by liquefaction then solidification, may have better electrical properties and may be advantageous for the creation of photovoltaic cells.

Example 2

A wafer of monocrystalline silicon doped to the level of 1E15/Cm2, of 100 microns thickness, constituting a layer 4 is considered.

As shown in FIG. 10, a flow from a frequency doubled YAG laser (priming flow 9) is sent onto the rear surface of the wafer through a mask 13 composed of a thin plate of polished silica on which a deposit of refractory and reflecting metal has been formed and etched so as to form a pattern of opaque areas 13a and transparent areas between said opaque areas 13a.

Typically, the priming flow 9 may be in the form of a pulse of 50 nS duration and transporting an energy density of the order of 0.6 J/Cm2, which corresponds to a flow intensity of 1.2*E7W/Cm2. In this way is created in the wafer (layer 4) priming regions 4a, the geometry of which is in the image of the pattern of the mask, according to the example of FIG. 9.

The main flow 7 may be a fibre laser flow at a wavelength of 1.55 microns. The flow begins 100 nS after the end of the priming flow 9 and has a duration of the order of 1.8 microseconds, with flows of intensity of the order of 5*E6W/Cm2.

The chronology of the priming flow 9 and the main flow 7 corresponds to that of FIG. 3.

At the end of the application of the priming flow 9, the maximum temperature obtained may be of the order of 1700 K.

One hundred nanoseconds after the end of the priming pulse, the time that corresponds to the start of the application of the main flow 7, the maximum temperature may then be around 1400 K.

It should be pointed out that the delay of 100 nS which is cited in this example between the end of the priming flow and the start of the main flow may be advantageously shortened, so as to benefit as best as possible from the rise in temperature of the priming region. An important delay of 100 nS has been introduced in this example to take account of possible imperfect synchronisation between the two flows 7 and 9.

The temperature Tsat obtained may be of the order of 1680 K.

The main flow 7 heats the wafer (layer 4) in priming regions 4a, whereas in the regions not corresponding to the priming regions 4a there is no heating.

The aim of such a method may for example be intended to diffuse impurities, for example metallic, into the heated areas 2a without the impurities from the non heated areas spreading.

In this second example, the characteristics and in particular the intensity of the main light flow 7 and the characteristics of the priming flow 9 may be chosen such that the main flow 7 is capable of compensating the flow of loss of temperature of the thermal profile at the time corresponding to the start of the main flow 7.

Indeed, it may be important that the absorption of the main flow 7 resulting from the temperature profile existing at this time can compensate the tendency of the temperature profile to widen and to subside due to thermal diffusion. If this was not the case, the lowering of the temperature profile would continue and the progressive thermal front 11 could not persist or exist.

The judicious choice of these characteristics may be made by simulating the evolution of the thermal profiles by the method known as finite differences in ID geometry, a method that forms part of the prior art and for which standard software exists.

In a variant, the heating of the priming layer or region 4 could be obtained by radiation from a very high power arc lamp focused by a lens.

The invention claimed is:

1. A method for at least locally heating a plate including at least one layer to be at least locally heated by at least one main light flow pulse,
the method comprising the following steps:
heating a priming region of said plate located behind or under a front surface of the at least one layer to be locally heated, at least partially by a priming secondary heating flow, wherein said priming region heats through thermal diffusion a portion of the layer to be heated adjacent to said priming region up to a temperature within a predetermined temperature range sufficient to make said portion highly absorbent of said main light flow;
applying the main light flow to the plate, at least locally, through the front surface of said layer to be heated, wherein the wavelength of said main light flow is chosen such that
the coefficient of absorption of this flow by the material of the layer to be heated is at a first level while the temperature of the layer to be heated is in a temperature range lower than the predetermined temperature range,
the absorption coefficient of this flow by the material of the layer to be heated increases relative to said first level with temperature as the temperature of the layer to be heated passes into the predetermined temperature range, and
the main light flow is, on its own, incapable of heating directly the material of the layer to be heated up to the predetermined temperature range, and
generating an absorbent thermal front, wherein said absorbent thermal front progresses towards the front surface under the combined effect of a thermal diffusion towards a front of the thermal front and an input of thermal energy by said main light flow which reaches the thermal front as soon as the temperature of the thermal front passes into said predetermined temperature range.

2. The method of claim 1, wherein said applying starts before the end of the application of said priming secondary heating flow.

3. The method of claim 2, wherein the wavelength of said main light flow is chosen such that the main light flow is absorbed by said priming region, the heating of said priming region being realised by said priming secondary heating flow and by said main light flow.

4. The method of claim 1, wherein said priming secondary heating flow is applied through at least one of said front surface of said layer to be heated and a surface of said plate opposite to said front surface.

5. The method of claim 1, wherein said priming secondary heating flow is a radiation flow, said priming region being heated by absorption of said radiation.

6. The method of claim 1, wherein said priming region is formed by a portion of said layer to be heated.

7. The method of claim 1, wherein said priming region is formed by a sub-layer adjacent to or near to said layer to be heated.

8. The method of claim 1, wherein said low temperature range and said high temperature range are separated by a transition threshold of the behaviour of the absorption coefficient as a function of temperature.

9. The method of claim 8, wherein said transition threshold of the behaviour of the absorption coefficient as a function of temperature extends over a range of temperature.

10. The method of claim 1, wherein the layer to be heated is doped silicon.

11. The method of claim 1, wherein the layer to be heated is a semi-conductor material.

12. The method of claim 1, wherein said low temperature range corresponds substantially to the range in which the saturation and/or gel of electrical carriers is not intrinsic and that said high temperature range corresponds substantially to the range in which the saturation and/or gel of electrical carriers is intrinsic.

13. The method of claim 1, wherein the main light flow is generated by a laser.

14. The method of claim 1, wherein the priming region is made of a material different from that of the layer to be heated.

* * * * *